United States Patent [19]
Calligaro et al.

[11] Patent Number: 5,838,612
[45] Date of Patent: Nov. 17, 1998

[54] READING CIRCUIT FOR MULTILEVEL NON VOLATILE MEMORY CELL DEVICES

[75] Inventors: Cristiano Calligaro, Torre D'Isola; Vincenzo Daniele, Brugherio; Roberto Gastaldi, Agrate Brianze; Alessandro Manstretta, Broni; Nicola Telecco, Monreale; Guido Torelli, S. Alessio, all of Italy

[73] Assignee: SGS-Thomson Microelectronics S.r.l., Agrate Brianza, Italy

[21] Appl. No.: 869,072

[22] Filed: Jun. 4, 1997

Related U.S. Application Data

[63] Continuation of Ser. No. 625,895, Apr. 1, 1996, abandoned.
[60] Provisional application No. 60/010,586, Jan. 25, 1996.

[30] Foreign Application Priority Data

Mar. 31, 1995 [EP] European Pat. Off. .............. 95830127

[51] Int. Cl.$^6$ .................................................. G11C 11/34
[52] U.S. Cl. .................................. 365/185.03; 365/185.2
[58] Field of Search ............................ 365/185.03, 185.2

[56] References Cited

U.S. PATENT DOCUMENTS

| | | | |
|---|---|---|---|
| 4,833,646 | 5/1989 | Turner | 365/185.2 |
| 4,967,394 | 10/1990 | Minagawa et al. | 365/185.2 |
| 5,012,448 | 4/1991 | Matsuoka et al. | 365/208 |
| 5,163,021 | 11/1992 | Mehrotra et al. | 365/185.03 |
| 5,521,865 | 5/1996 | Ohuchi et al. | 365/185.03 |

FOREIGN PATENT DOCUMENTS

| | | |
|---|---|---|
| 0 394 705 | 10/1990 | European Pat. Off. . |
| 84/00840 | 8/1982 | WIPO . |

OTHER PUBLICATIONS

IBM Technical Disclosure Bulletin, "Mid–Level Current Generator Circuit", vol. 33, No. 1B, Jun. 1990, pp. 386–388.

*Primary Examiner*—David C. Nelms
*Assistant Examiner*—Michael T. Tran

[57] ABSTRACT

Reading circuit for multilevel non-volatile memory cell devices having, for each cell to be read, a selection line with which is associated a load and a decoupling and control stage with a feedback loop which stabilizes the voltage on a circuit node of the selection line. To this node are connected a current replica circuit which are controlled by the feedback loop. These include loads and circuit elements homologous to those associated with the selection line of the memory cell and have an output interface circuit for connection to current comparator circuit.

9 Claims, 2 Drawing Sheets

READING CIRCUIT FOR MULTILEVEL NON VOLATILE MEMORY CELL DEVICES

This application is a continuation of application Ser. No. 08/625,895, filed Apr. 1, 1996 and now abandoned.

CROSS-REFERENCE TO RELATED APPLICATION

This application claims priority from provisional 60/010,586 filed Jan. 25, 1996, and from EPC app'n 95830127.7 filed Mar. 31, 1995, both of which are hereby incorporated by reference.

BACKGROUND AND SUMMARY OF THE INVENTION

The present invention relates to reading circuits for data stored in memory cell devices and specifically for reading multilevel non-volatile memory cell devices.

Continually growing market demand for semiconductor memory devices has led manufacturers towards very high density non-volatile memories ("multimegabit memories") and an increase of the integration areas despite the evolution of technological processes.

Non-volatile memory cells (i.e. memory cells which preserve their programming status even in the absence of electric power) are very similar to a MOS field effect transistor.

By appropriately biasing the field effect transistor of a memory cell it is possible to change the voltage threshold thereof by injection of "hot" electrons in a floating "gate" as in EPROM and FLASH memories or by injection of electrons by tunnel effect as in EEPROM memories.

To determine the programming status of a non-volatile memory cell, i.e. to "read" or "sense" its content, a predetermined voltage is applied to a "control gate" of the cell and compares the threshold voltage of the field effect transistor which the cell forms with this fixed voltage.

In classical memory cells programming them takes place by determination of only two quite distinct threshold levels.

The above mentioned market requirements to be able to increase the information content in memory devices without further increasing the integration areas on semiconductors, and the achieved technical capacity of a finer adjustment of the charge injection in the "floating gate" of the memory cells, have led to the realization of devices with different threshold voltages.

The memory cells in this case are termed "multilevel" and can memorize more than one bit which is the elementary information.

A non-volatile memory cell with four threshold voltages, for example, can memorize two bits while a cell with sixteen different threshold values can memorize up to four bits.

A memory cell must generally have $m=2^n$ distinct levels or programming states to be able to contain a number "n" of bits.

For a given area (and in a non-volatile memory device the so-called memory cell matrix constitutes the larger part) a multilevel memory cell device can memorize information contents many times which can be memorized in a memory device with standard memory cells.

As for the standard 2-level memory cells, for memory cells programmed with different threshold values and hence capable of delivering different currents with fixed reading bias conditions, the discrimination of different programming levels can be performed in "series mode" or in "parallel mode".

In series mode a single reference is used, in current or in voltage, which can be varied with a known pattern.

This reference is used for a series of successive comparisons in time so as to approximate the "analog level" (in terms of threshold voltage or of current delivered by the cell) memorized in the selected memory element.

A circuit solution for serial mode reading in voltage is described, for example, in the publication "A Multilevel-Cell 32 Mb Flash Memory" ISSCC96/SESSION 7/FLASH MEMORY/PAPER TA 7.7 for the 1995 IEEE International Solid-State Circuit Conference, while a solution for serial mode reading in current is described in European Patent application No. 95830110.3 filed 23 Mar. 1995 by this same applicant.

Parallel mode constitutes the natural evolution of the methodology presently in use for reading 2-level cells by means of a reference cell.

Starting from a circuit block for generation of "m-1" references (of current or voltage depending on the reading procedure) for a memory cell with "m" levels there are made "m-1" simultaneous comparisons between these references and the corresponding magnitude (current or voltage) derived from the selected cell.

The parallel reading mode allows highest, decoding speed for a non-volatile memory device.

The known circuitry solutions presently use a parallel reading mode in voltage and are described for example in U.S. Pat. Nos. 4,964,079, 5,043,940 and 5,119,330.

The technical problem underlying the present invention is to provide a reading circuit for devices with multilevel non-volatile memory cells allowing highest decoding speed of the information and a higher memorization power for data than those of known devices for a given integration area of the memory cell matrix.

This technical problem is solved by a reading circuit for memory cells with parallel mode, characterized in that current replica circuit means are inserted between the decoupling and control stage and the first input terminal of each of the current comparator circuit means and are controlled by said feedback loop of the stage. The reading circuit is further characterized in that each current replica circuit means comprises a first and a second transistor inserted in series between them by means of respective first and second terminals between a second reference potential and a load of the same type as the line load and also connected to the power supply line with said first and second transistors having respective control terminals connected respectively to said circuit node which is the common reference potential and one directly and the other through the inverter circuit and in that it comprises interface circuit means for coupling to the respective current comparator circuit means which have at least one control terminal connected to a circuit node for connection between said first and second transistors.

The characteristics and advantages of a reading circuit in accordance with the present invention are set forth in the description of an embodiment thereof given below by way of non-limiting example with reference to the annexed drawings.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment (by way of example, and not of limitation), in which:

In accordance with the present invention it is possible to provide a reading circuit for multilevel non-volatile memory cells which operate in current in parallel mode without the shortcomings of interference between the simultaneous comparisons among reference magnitudes which distorted their results and prevented practical application thereof.

The path followed by those skilled in the art was that of division of the current made to flow from the memory cell through the selection line connected to the cell in reading phase or that of mirroring this current by means of a current mirror circuit having transistors connected to a common node.

The problem of the first method is, however, to have low current flows when the number of levels to be discriminated is high and thus having to restrict the number of bits memorized while the second is subject to rejection on the connection node which is avoidable only with another current mirror circuit connected to each branch of the main one.

The cascade of current mirror circuits introduces, however, additional delays and hence decreases the speed achievable in reading operations.

Figure 1:
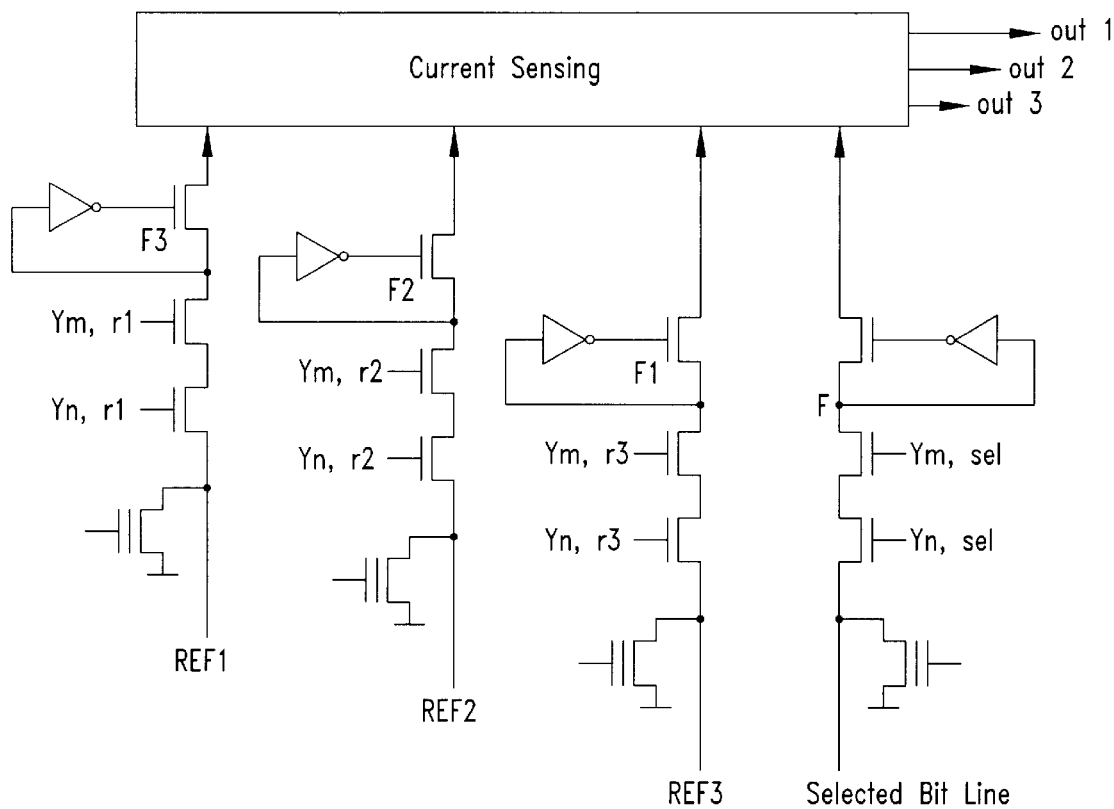
FIG. 1 shows the general diagram of a reading circuit with parallel mode in current for 4-level non-volatile memory cells as an embodiment of the present invention.

FIG. 1 of the drawings shows a classical diagram summarizing a parallel reading circuit in current, and in particular, as an example for 4-level non-volatile memory cells which can thus memorize a 2-bit information.

To a circuit, Current Sensing, designed to compare current flows and generate therefrom comparisons of output signals OUT1, OUT2 and OUT3 are connected three lines connected to three reference currents (in general memory cells Ref1, Ref2 and Ref3 and a selection line (Selected Bit Line) for the memory cell on which the reading operation is planned.

In the FIGS. are also indicated circuit means (transistors) for selection of the group of lines and, as known in the literature (Gastaldi, Novosel, Dallabora, Casagrande, "A 1-Mbit CMOS EPROM with Enhanced Verification", IEEE JSSC, vol. 23, Notes, pp.1150–1156, October 1988), circuit means for decoupling and control which, by means of a feedback loop with inverter, set the potential of the nodes F, F1, F2 and F3.

Typically a memory cell with 4 levels can be programmed to supply in reading phase the following possible current intensities:

| level | current |
|---|---|
| "0" | 0 μA |
| "1" | 15 μA |
| "2" | 30 μA |
| "3" | 45 μA |

The reference currents can be virgin cells, i.e. unprogrammed, supplying possible nominal currents for a given supply voltage of the memory device. For example, for EEPROM memory devices with 3V power supply reference currents of 15, 30 and 45 μA can be used.

Thus if the memory cells are programmable at previously indicated current levels, in the reading phase there can be the following comparisons:

|  | Selected Cell |
|---|---|
| 1st Reference Cell |  |
| 45 μA | 45 μA ("3") |
| 45 μA | 30 μA ("2") |
| 45 μA | 15 μA ("1") |
| 45 μA | 0 μA ("0") |
| 2nd Reference Cell |  |
| 30 μA | 45 μA ("3") |
| 30 μA | 30 μA ("2") |
| 30 μA | 15 μA ("1") |
| 30 μA | 0 μA ("0") |
| 3rd Reference Cell |  |
| 15 μA | 45 μA ("3") |
| 15 μA | 30 μA ("2") |
| 15 μA | 15 μA ("1") |
| 15 μA | 0 μA ("0") |

Figure 2:
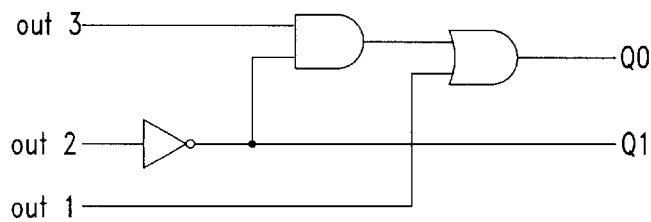
FIG. 2 shows the circuit diagram of a decoding circuit necessary for converting in bits the discrimination of the 4 levels of the memory cell which it is desired to read in accordance with the above mentioned embodiment.
Figure 3:
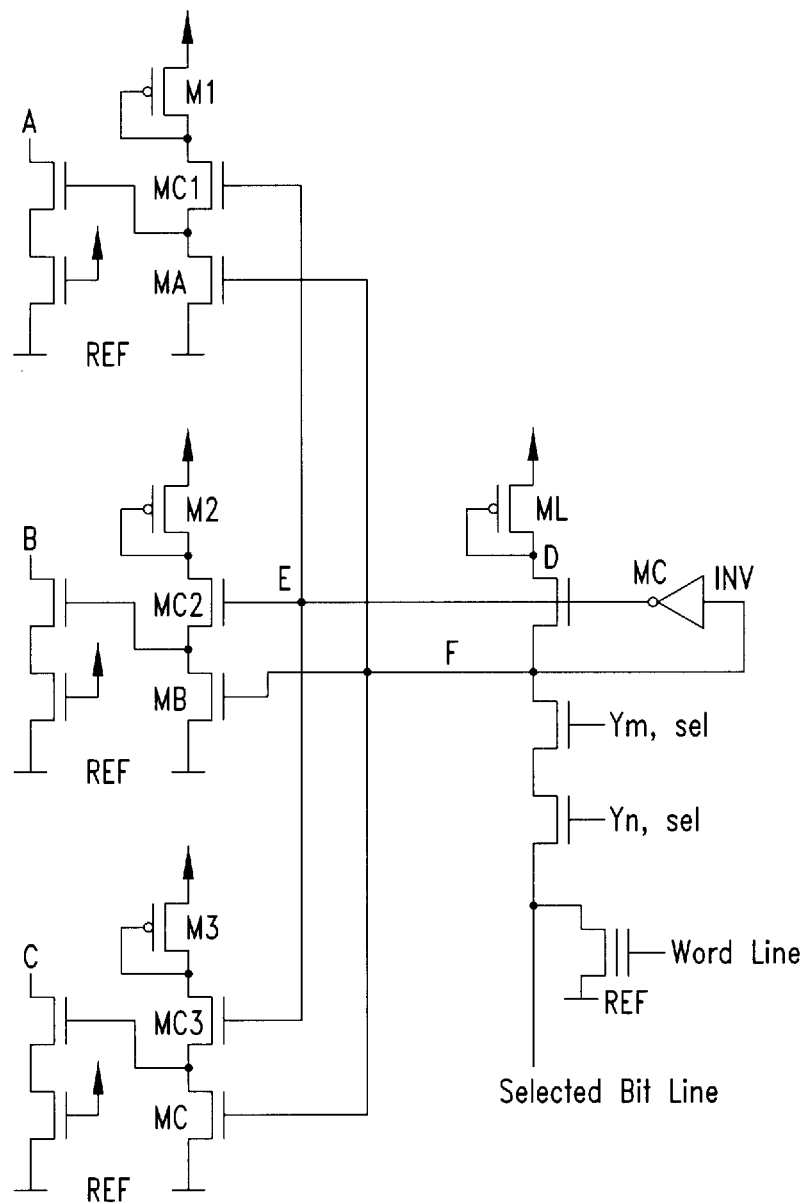
FIG. 3 shows a circuit diagram of the part of the reading circuit permitting a replica in current for comparison with reference currents.

If it is assumed that the result of each comparison is positive, i.e. with high logic level "1", when the cell current is less than the reference current and negative, i.e. "0", when it is equal to or higher than, it is seen from the table that the outlets OUT1, OUT2 and OUT3 can have four distinct logic level configurations. FIG. 2 shows a possible example of a circuit for decoding these possible comparison logic signals achieving at output only two bits Q0 and Q1. FIG. 3 shows the circuit solution which, in accordance with the present invention, allows realization of an actual reading circuit for non-volatile memory cells capable of operating in current with parallel mode with the highest speed for reading operations and discrimination capability for very high current levels.

The present invention is based on the "current replica" concept by means of circuits homologous as to loads and components to that in which flows the current it is desired to replicate and which are simultaneously activated through circuit nodes adjusted to hold stable potential conditions.

In the FIGS. are indicated by an arrow the connections to a power supply line and by REF a reference potential which could be a ground.

The diode-connected p-channel transistors M1, M2 and M3 are loads homologous to the load of the selection line consisting of a diode-connected p-channel transistor ML.

Between the line load ML and the selection line, with its selection means Ym,sel and Yn,sel, is inserted a decoupling and control stage comprising an n-channel transistor MC like the homologues MC1, MC2 and MC3 connected to an inverter INV which pilots in feedback as explained in the above mentioned article.

The circuit node F is adjusted to a steady potential and from it is activated the current replica through the N-channel transistors MA, MB and MC which have their control terminal connected to the circuit node F.

The transistors MC1, MC2 and MC3 are inserted respectively between the transistors MA, MB and MC and their loads M1, M2 and M3, like the transistor MF, are inserted in a feedback loop with the same inverter INV.

In accordance with the present invention, included in the reading circuit are also interface circuit means A, B and C which are part of the replica circuit means and can be made up of a pair of n-channel transistors in series with each other and one of which has its control terminal connected to the power supply line and the other to a connection node between the two respective replica transistors for A, B and C respectively MC1, MA and MC2, MB and MC3, MC.

These interface circuit means permit, without introducing harmful delays, connection without rejections to the current comparator circuit means, not shown in the figures, which permit discrimination of the current levels.

Naturally for every selection line a reading circuit in accordance with the present invention includes a circuit for decoding in bits the results of the current level discrimination operation.

The embodiment now described is for the reading of 4-level memory cells but the same replication operation can be performed for memory cells with 16 or 256 levels for 4 or 8 bits respectively.

It is merely necessary to introduce in the reading circuit as many current replica circuit means as there are current references for the discrimination of the levels.

It is clear that modification, integration and replacement of elements can be made to the embodiment described above in a manner known to those skilled in the art.

For example, the control terminals of the transistors MA, MB and MC could be connected to a reference potential equivalent to that of the circuit node F.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

What is claimed is:

1. Reading circuit for multilevel non-volatile memory cell devices, said reading circuit comprising, for each memory cell to be read:
   a decoding circuit,
   a selection line having a node which is voltage-stabilized by means of a feedback loop,
   a group of lines for connection to reference currents,
   a group of current comparator circuit means, each having an output terminal connected to said decoding circuit, with first and a second input terminal of each of said current comparator circuit means respectively coupled to said selection line and to a respective connection line of one of said reference currents,
   a decoupling and control stage comprising a transistor connected to said voltage-stabilized node of said selection line and through a selection-line load to a power supply, said transistor having a control terminal connected to said voltage-stabilized node through an inverter,
   wherein current replica circuit means are inserted between said decoupling and control stage and said first input terminal of each of said current comparator circuit means and are controlled by said feedback loop,
   wherein each said current replica circuit means comprises a first and a second transistor connected in series between a second reference potential and a load homologous to said selection-line load and also connected to the power supply, said first transistor having a control terminal connected to said voltage-stabilized node, said second transistor having a control terminal connected to said voltage-stabilized node through an inverter circuit, and
   interface means for coupling to respective current comparator circuit means, said interface means having at least one control terminal connected to a circuit node between said first and second transistors.

2. Reading circuit of claim 1, wherein each said current replica circuit means are connected to a common reference potential and their number and that of said reference currents and that of said current comparator circuit means are at least equal to the number less one of the programming levels of the memory cell connected to said selection line.

3. Reading circuit of claim 1, wherein said transistor of said decoupling and control stage and said first and second transistors of each of said current replica circuit means are n-channel MOS transistors.

4. Reading circuit of claim 1, wherein said selection line load and said load in each of said current replica circuit means are diode-connected p-channel MOS transistors.

5. A reading circuit for multilevel non-volatile memory cell devices, comprising:
   a selection line comprising
      a selection line load and
      a selection line transistor connected between said load and a first node, said selection line transistor being driven by an inverter which is connected to said first node;
   n-1 current replica circuits, where n is the number of programming levels to which the memory cell devices may be programmed, each current replica circuit comprising:
      a load which is homologous to said selection line load,
      a first transistor which is homologous to said selection line transistor and which is driven by said inverter, and
      a second transistor which is driven by said first node,
      a node between said first and said second transistor driving a third transistor of an interface circuit.

6. The reading circuit of claim 5, wherein said selection line load comprises a diode-connected p-channel transistor.

7. The reading circuit of claim 5, wherein said selection line transistor comprises an n-channel transistor.

8. The reading circuit of claim 5, wherein said second transistor comprises an n-channel transistor.

9. The reading circuit of claim 5, wherein said interface circuit further comprises a fourth transistor which is connected in series between said third transistor and a reference voltage.

* * * * *